US012382800B2

(12) United States Patent
Qiu et al.

(10) Patent No.: US 12,382,800 B2
(45) Date of Patent: Aug. 5, 2025

(54) DISPLAY PANEL, METHOD FOR MANUFACTURING DISPLAY PANEL, AND DISPLAY DEVICE

(71) Applicants: Chengdu BOE Optoelectronics Technology Co., Ltd., Sichuan (CN); BOE TECHNOLOGY GROUP CO., LTD., Beijing (CN)

(72) Inventors: Yuanyou Qiu, Beijing (CN); Yao Huang, Beijing (CN); Weiyun Huang, Beijing (CN); Benlian Wang, Beijing (CN)

(73) Assignees: Chengdu BOE Optoelectronics Technology Co., Ltd., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 470 days.

(21) Appl. No.: 17/921,655

(22) PCT Filed: Sep. 1, 2021

(86) PCT No.: PCT/CN2021/116031
§ 371 (c)(1),
(2) Date: Oct. 27, 2022

(87) PCT Pub. No.: WO2022/088959
PCT Pub. Date: May 5, 2022

(65) Prior Publication Data
US 2023/0172014 A1    Jun. 1, 2023

(30) Foreign Application Priority Data
Oct. 30, 2020  (CN) .......................... 202011193209.6

(51) Int. Cl.
*H10K 59/131*    (2023.01)
*H10K 59/12*    (2023.01)
(Continued)

(52) U.S. Cl.
CPC ....... *H10K 59/131* (2023.02); *H10K 59/1201* (2023.02); *H10K 59/65* (2023.02); *H10K 59/80521* (2023.02)

(58) Field of Classification Search
CPC .......................... H10K 59/131; H10K 59/1201
See application file for complete search history.

(56) References Cited

U.S. PATENT DOCUMENTS 10,459,531 B2    10/2019  Hashida
2016/0322452 A1   11/2016  Tsuruoka et al.
(Continued)

FOREIGN PATENT DOCUMENTS

CN    108389879 A    8/2018
CN    109950290 A    6/2019
(Continued)

*Primary Examiner* — Douglas M Menz
(74) *Attorney, Agent, or Firm* — HOUTTEMAN LAW LLC

(57) ABSTRACT

Provided are a display panel and a manufacturing method therefor, and a display device. The display panel includes a base substrate, first and second light emitting units, and first and second pixel circuits driving the first and second light emitting units to emit light, respectively, the second pixel circuit includes first and second via holes, a drain in the second pixel circuit has first and connection terminals and a connection body extending along a first direction, the first via hole connects the first connection terminal with an active layer in the second pixel circuit, the connection body has a length greater than or equal to a length of a storage capacitor in the first direction, a first wire is on a side of a source-drain electrode layer, connects to the second connection terminal through the second via hole, connects to an anode of the second light emitting unit.

20 Claims, 11 Drawing Sheets

(51) Int. Cl.
    *H10K 59/65*    (2023.01)
    *H10K 59/80*    (2023.01)

(56) References Cited

U.S. PATENT DOCUMENTS

| | | |
|---|---|---|
| 2019/0267558 A1 | 8/2019 | Wang et al. |
| 2021/0091147 A1* | 3/2021 | Liu .................. H10K 59/80517 |
| 2021/0183983 A1* | 6/2021 | Bang .................... H10K 59/121 |
| 2021/0208633 A1* | 7/2021 | Ma ...................... H10K 59/131 |
| 2021/0408055 A1 | 12/2021 | Hu |
| 2022/0069048 A1* | 3/2022 | Bok .................... H10K 59/131 |
| 2022/0149117 A1 | 5/2022 | Yuan |

FOREIGN PATENT DOCUMENTS

| | | |
|---|---|---|
| CN | 110288945 A | 9/2019 |
| CN | 110571242 A | 12/2019 |
| CN | 110783487 A | 2/2020 |
| CN | 110853497 A | 2/2020 |
| CN | 210182387 U | 3/2020 |
| CN | 111180494 A | 5/2020 |
| CN | 111785853 A | 10/2020 |
| WO | WO2016199263 A1 | 12/2016 |

* cited by examiner

DISPLAY PANEL, METHOD FOR MANUFACTURING DISPLAY PANEL, AND DISPLAY DEVICE

CROSS-REFERENCE TO RELATED APPLICATIONS

The present disclosure claims priority of Chinese patent application No. 202011193209.6, filed to Chinese Patent Office on Oct. 30, 2020, which is incorporated herein by reference in its entirety.

TECHNICAL FIELD

The present disclosure relates to the field of display technology, and in particular, to a display panel, a method for manufacturing the display panel, and a display device.

BACKGROUND

At present, in order to improve light transmittance of a high-light-transmission display area corresponding to an under display camera (i.e., a camera under a screen) and ensure the photographing effect of the under display camera, only an EL (i.e., electroluminescent) device is retained in the high-light-transmission display area, and a signal for controlling the EL device to emit light is led out from a pixel circuit in a non-light-transmission display area. However, shooting quality of the under display camera is still relatively poor at present due to poor light transmittance.

Therefore, a display panel with the under display camera is desired to be further researched.

SUMMARY

The present disclosure is directed to solving at least one of technical problems in the related art to a certain extent. For such a purpose, an object of the present disclosure is to provide a display panel in which a light transmittance of a second display area (a display area corresponding to a region where an under display camera is disposed) is relatively high.

In an aspect, the present disclosure provides a display panel. According to an embodiment of the present disclosure, the display panel includes a first display area and a second display area, the first display area is arranged on a side of the second display area and the second display area is arranged opposite to an under display camera, where the display panel includes a base substrate, the first display area includes a plurality of first light emitting units, a plurality of second pixel circuits and a plurality of first pixel circuits disposed on the base substrate, the second pixel circuits and the first pixel circuits are arranged in an array along a first direction and a second direction, the first pixel circuits are configured to drive the first light emitting units to emit light, and the first direction intersects the second direction; the second display area includes a plurality of second light emitting units disposed on the base substrate, the second pixel circuits are configured to drive the second light emitting units to emit light, each of the second pixel circuits and the first pixel circuits includes an active layer, a source-drain electrode layer, a gate line and a storage capacitor, each second pixel circuit further includes a first via hole and a second via hole, the source-drain electrode layer in the second pixel circuit includes a drain electrode, the drain electrode includes a first connection terminal, a second connection terminal and a connection body connecting the first connection terminal with the second connection terminal, where the first via hole is configured to electrically connect the first connection terminal with the active layer in the second pixel circuit, the connection body extends along the first direction, a length of the connection body is greater than or equal to a length of the storage capacitor in the first direction, the gate line extends along the second direction, the gate line includes a reset control signal line, a scan signal line and a light emitting control signal line, an an orthographic projection of the second via hole on the base substrate overlaps an orthographic projection of the scan signal line on the base substrate, the display panel further includes a plurality of first wires disposed on a side, away from the base substrate, of the source-drain electrode layer, each first wire is electrically connected with the second connection terminal through the second via hole, and is electrically connected with an anode of the second light emitting unit through a third via hole in the second display area to drive the second light emitting unit to emit light.

With such configurations, the drain electrode of above-mentioned structure and a position of connection between the first wire and the drain electrode facilitate to optimizing an arrangement of the first wires, and thus can reduce an area of the anode of the second light emitting unit electrically connected with the first wire, and can further improve the light transmittance of the second display area so as to increase an amount of incoming light of the under display camera and improve shooting effect of the under display camera.

In some implementations, each first pixel circuit further includes a fourth via hole and a fifth via hole, the fourth via hole is configured to electrically connect the source-drain electrode layer in the first pixel circuit with an anode of the first light emitting unit, the fifth via hole is configured to electrically connect the source-drain electrode layer in the first pixel circuit with the active layer, and an orthographic projection of the fourth via hole on the base substrate overlaps an orthographic projection of the fifth via hole on the base substrate.

In some implementations, an orthographic projection of the connection body on the base substrate overlaps an orthographic projection of the storage capacitor on the base substrate.

In some implementations, each first wire includes a first sub-wire and a second sub-wire in the first direction, and orthographic projections of the first sub-wire and the second sub-wire on the base substrate are not overlapped with an orthographic projection of the connection body on the base substrate.

In some implementations, the orthographic projection of the first sub-wire on the base substrate overlaps an orthographic projection of a sixth via hole on the base substrate, the sixth via hole is configured to electrically connect a data writing transistor with a data line; the orthographic projection of the second sub-wire on the base substrate overlaps an orthographic projection of a seventh via hole on the base substrate, the seventh via hole is configured to electrically connect a first terminal of a first connection portion of the source-drain electrode layer with a threshold compensating transistor, and the first connection portion is configured to connect a source/drain electrode of the threshold compensating transistor with a source/drain electrode of a driving transistor.

In some implementations, an orthographic projection of the second connection terminal in the second direction overlaps an orthographic projection of a middle body of the first connection portion in the second direction.

In some implementations, each first wire further includes a third sub-wire in the first direction, and an orthographic projection of the third sub-wire on the base substrate overlaps the orthographic projection of the connection body on the base substrate.

In some implementations, the orthographic projection of the third sub-wire on the base substrate overlaps an orthographic projection of an eighth via hole on the base substrate, and the eighth via hole is configured to electrically connect a second terminal of the first connection portion with a gate electrode of the driving transistor.

In some implementations, the anode of the second light emitting unit includes a body and a protruding portion, each first wire is disposed corresponding to the anode of the second light emitting unit, and each first wire is electrically connected to the protruding portion through the second via hole.

In some implementations, a distance between a surface of the body of the anode of the second light emitting unit away from the base substrate and a surface of the first wire away from the base substrate is d1, a distance between a surface of the protruding portion of the anode of the second light emitting unit away from the base substrate and a surface of the first wire away from the base substrate is d2, and a ratio of d1 to d2 ranges from 0.8 to 1.2.

In some implementations, a ratio of an area of a light emitting region of the first light emitting unit to an area of a light emitting region of the second light emitting unit ranges from 0.9 to 1.1.

In some implementations, a transition display area is provided between the first display area and the second display area, the transition display area is provided therein with a third pixel circuit, a third light emitting unit, and a fourth pixel circuit, and the third pixel circuit is configured to drive the third light emitting unit to emit light.

In some implementations, a plurality of second wires are disposed in the second display area at an edge thereof close to the transition display area, and the second wires are disposed in the same layer as the source-drain electrode layer, and are configured to transmit a reset signal and a charging signal in the first display area.

In some implementations, the display panel includes: the base substrate; the active layer arranged on a side of the base substrate; a gate insulating layer arranged on a side of the base substrate and the active layer; a gate electrode arranged on a surface of the gate insulating layer away from the base substrate; an interlayer dielectric layer arranged on surfaces, away from the base substrate, of the gate insulating layer and the gate electrode, the first via hole penetrating through the gate insulating layer and the interlayer dielectric layer; the source-drain electrode layer arranged on a surface of the interlayer dielectric layer away from the base substrate; a first planarization layer arranged on a side, away from the base substrate, of the interlayer dielectric layer and the source-drain electrode layer, the second via hole penetrating through the first planarization layer; the first wires arranged on a side, away from the base substrate, of the first planarization layer and each electrically connected with the second connection terminal through the second via hole; a second planarization layer arranged on a side, away from the base substrate, of the first planarization layer and the first wires, the third via hole penetrating through the second planarization layer, and each first wire being electrically connected with the anode of the second light emitting unit through the third via hole.

In some implementations, the second display area is provided therein with a plurality of patterned cathode layers, and an orthographic projection of each patterned cathode layer on the base substrate covers an orthographic projection of an anode of at least one of the second light emitting units on the base substrate.

In some implementations, cathodes of light emitting units in the first display area and the transition display area are formed into one piece in a same layer.

In some implementations, the display panel further includes a plurality of third wires, where the third wires are disposed in the same layer as the first wires, each of the patterned cathode layers is provided corresponding to one third wire, and the third wires are configured to electrically connect the patterned cathode layers with a VSS signal line.

In some implementations, the display panel further includes a plurality of package sub-layers arranged at intervals, where the package sub-layers are arranged in correspondence with the patterned cathode layers one to one, and an orthographic projection of each of the package sub-layers on the base substrate covers an orthographic projection of one of the patterned cathode layers on the base substrate.

In some implementations, the first wires and the third wires are made of ITO or IZO.

In another aspect, the present disclosure provides a method for manufacturing the display panel described above. According to an embodiment of the present disclosure, the display panel includes a first display area and a second display area, the first display area is disposed on a side of the second display area, and the second display area is arranged opposite to an under display camera, the method includes: providing a base substrate, and forming a plurality of second pixel circuits and a plurality of first pixel circuits arranged in an array along a first direction and a second direction and a plurality of first light emitting units in a region of the base substrate corresponding to the first display area, the first pixel circuits being configured to drive the first light emitting units to emit light, and the first direction intersecting the second direction; forming a plurality of second light emitting units in a region of the base substrate corresponding to the second display area, the second pixel circuits being configured to drive the second light emitting units to emit light, where forming the second pixel circuits and the first pixel circuits includes forming an active layer, a source-drain electrode layer, a gate line, and a storage capacitor, and further includes forming a first via hole and a second via hole in each second pixel circuit, the source-drain electrode layer in each second pixel circuit includes a drain electrode, the drain electrode has a first connection terminal, a second connection terminal, and a connection body connecting the first connection terminal with the second connection terminal, the first via hole is configured to electrically connect the first connection terminal with the active layer in the second pixel circuit, the connection body extends along the first direction, a length of the connection body is greater than or equal to a length of the storage capacitor in the first direction, the gate line extends along the second direction, the gate line includes a reset control signal line, a scan signal line and a light emitting control signal line, and an orthographic projection of the second via hole on the base substrate overlaps an orthographic projection of the scan signal line on the base substrate; and forming a plurality of first wires on a side of the source-drain electrode layer away from the base substrate, where each first wire is electrically connected with the second connection terminal through the second via hole and is electrically connected with an anode of the second light emitting unit through a third via hole in the second display area to drive the second light emitting unit to emit light.

With such configurations, the drain electrode of above-mentioned structure and a position of connections between the first wire and the drain electrode facilitates to optimizing an arrangement of the first wires, and thus can reduce an area of the anode of the second light emitting unit electrically connected with the first wire, and can further improve the light transmittance of the second display area so as to increase an amount of incoming light of the under display camera and improve shooting effect of the under display camera. Moreover, the method described above has mature processes, is easy to be implemented and is convenient for industrial production.

In some implementations, the method of manufacturing the display panel further includes: forming the anode of the second light emitting unit by etching, the anode includes a body and a protruding portion, and the first wire is electrically connected to the protruding portion through the second via hole.

In some implementations, the method of manufacturing the display panel further includes: patterning a cathode in the second display area to obtain the patterned cathode layers, where an orthographic projection of each patterned cathode layer on the base substrate covers an orthographic projection of the anode of at least one of the second light emitting units on the base substrate.

In another aspect, the present disclosure provides a display device. According to an embodiment of the present disclosure, the display device includes: the display panel described above, or the display panel manufactured by the method described above; an under display camera provided on a back of the display panel, an orthographic projection of the the under display camera on the display panel overlapping the second display area of the display panel. With such configurations, the under display camera in the display device has sufficient incoming light, thereby effectively improving the shooting quality of the under display camera. Those skilled in the art should understand that the display device has all the features and advantages of the display panel described above, which will not be repeated here.

DETAIL DESCRIPTION OF EMBODIMENTS

Embodiments of the present disclosure are described in detail below. The following embodiments are described as illustrative only and are not to be construed as limiting the present disclosure. The embodiments without particular technology or conditions are implemented according to the technology or conditions described in literatures in the art or according to specification of a product.

In an aspect, the present disclosure provides a display panel. According to an embodiment of the present disclosure, referring to FIG. 1, the display panel includes a first display area a and a second display area b, the first display area a is disposed on a side of the second display area b, and the second display area b is disposed opposite to an under display camera (i.e., a camera under a screen). The second display area b being disposed opposite to the under display camera means that an orthographic projection of the under display camera on the display panel is completely overlapped with the second display area b, or the orthographic projection of the under display camera on the display panel covers the second display area b, or the orthographic projection of the under display camera on the display panel is covered by the second display area b.

Figure 1:
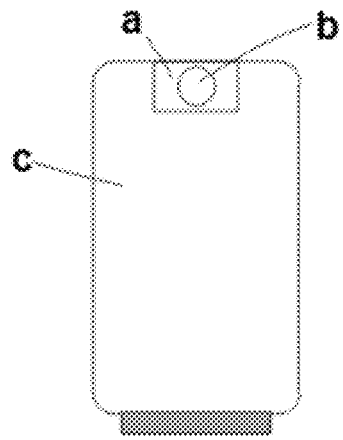
FIG. 1 is a schematic diagram of partition of a display area of a display panel according to an embodiment of the present disclosure.

A position where the second display area b is disposed is not particularly limited, and those skilled in the art may flexibly select the second display area according to actual expectations for design of an under display functional area (i.e., a functional area under a screen), for example, the second display area may be a central area of the display panel, or may be at a corner of the display panel, or may be located at a position of the display panel close to a bezel and centered (in a middle of a side of the bezel) as shown in FIG. 1. Moreover, a shape of the second display area b is not particularly limited, and those skilled in the art may flexibly select the shape of the second display area according to actual situations, such as a designed shape of the under display camera, for example, the shape of the second display area b includes, but is not limited to, a circle, an ellipse, a polygon such as a quadrangle, a pentagon and a hexagon, or an irregular pattern.

In addition, as shown in FIG. 1, the display panel further includes a third display area c, and the third display area c is located on a side of the first display area a away from the second display area b. Compared to the first display area and the second display area, the third display area is a display area with a relatively high PPI (i.e., pixels per inch for indicating a pixel density), that is, the PPI of the third display area is greater than that of the first display area and that of the second display area.

Figure 2:
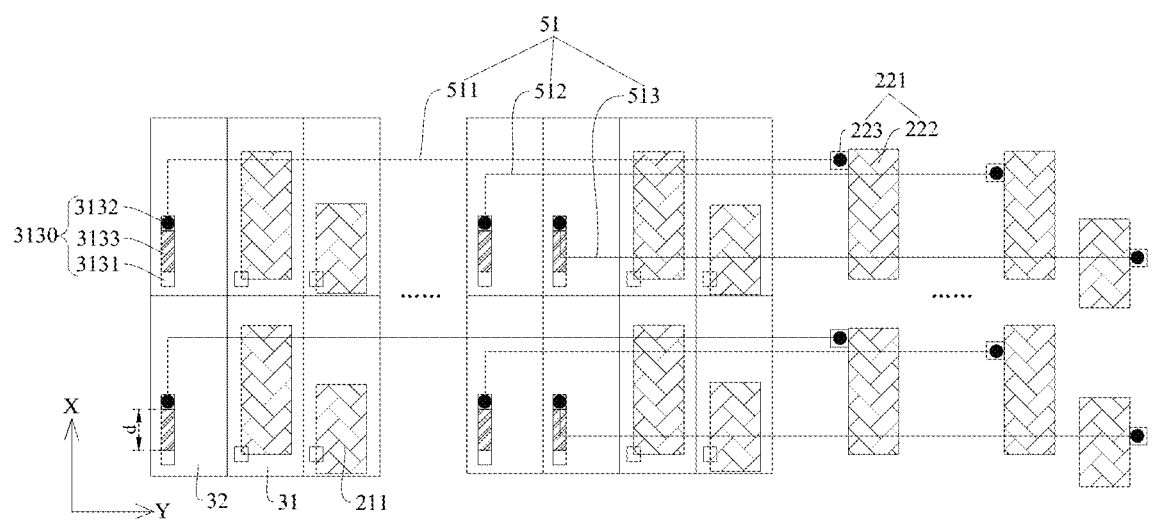
FIG. 2 is a schematic plan view of a partial structure of a display panel according to an embodiment of the present disclosure.
Figure 3:
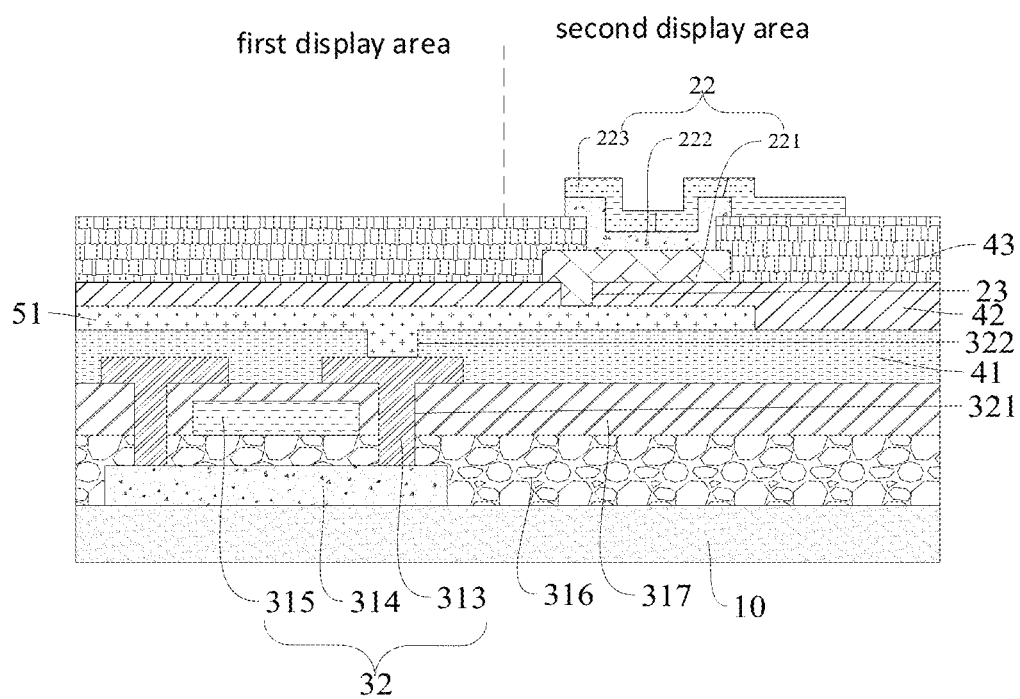
FIG. 3 is a schematic diagram of a display panel according to an embodiment of the present disclosure.

Referring to FIGS. 2 and 3, the display panel includes a base substrate 10, and the first display area includes a plurality of first light emitting units 21, a plurality of second pixel circuits 32 and a plurality of first pixel circuits 31 disposed on the base substrate 10, the second pixel circuits 32 and the first pixel circuits 31 are arranged in an array along a first direction X and a second direction Y, the first pixel circuits 31 are configured to drive the first light emitting units 21 to emit light, where the first direction X intersects the second direction Y. The second display area b includes a plurality of second light emitting units 22 disposed on the base substrate 10, the second pixel circuits 32 are configured to drive the second light emitting units 22 to emit light, the second pixel circuits 32 and the first pixel circuits 31 each include an active layer 314, a source-drain electrode layer 313, a gate line 315, and a storage capacitor. Each second pixel circuit 32 further includes a first via hole 321 and a second via hole 322, the source-drain electrode layer 313 in each second pixel circuit 32 includes a drain electrode 3130, the drain electrode 3130 has a first connection terminal 3131, a second connection terminal 3132, and a connection body 3133 connecting the first connection terminal 3131 with the second connection terminal 3132, where the first via hole 321 is configured to electrically connect the active layer 314 in the second pixel circuit 32 with the first connection terminal 3131, and the connection body 3133 extends along the first direction X, the gate line 315 extends along the second direction Y, the display panel further includes a plurality of first wires 51, the first wires 51 are located on a side of the source-drain electrode layer 313 away from the base substrate 10, and each first wire 51 is electrically connected to the second connection terminal 3132 through the second via hole 322 and electrically connected to the anode 221 of the second light emitting unit 22 through a third via hole 23 in the second display area b, so as to drive the second light emitting unit 22 to emit light.

With such configurations, the drain electrode 3130 of the above-mentioned structure and a position of connection between the first wire 51 and the drain electrode 3130 facilitates to optimizing an arrangement of the first wires 51, and thus can reduce an area of the anode 221 of the second light emitting unit 22 electrically connected with the the first wire 51, and can further improve the light transmittance of the second display area so as to increase an amount of incoming light of the under display camera and improve shooting effect of the under display camera.

According to the embodiment of the present disclosure, as shown in FIG. 2, a length d of the connection body is equal to or greater than a length of the storage capacitor in the first direction (FIG. 2 shows a structure of the storage capacitor, and with reference to FIG. 2, the length d of the connection body is equal to or greater than the length of the storage capacitor in the first direction). With such configurations, it is favor of a reasonable layout of the first wires 51, and can reduce a size of the anode 221 of the second light emitting unit 22 electrically connected with the first wire as much as possible, and thus improve the light transmittance of the second display area.

In some implementations, referring to FIG. 3, the display panel includes: the base substrate 10; the active layer 314 arranged on a side of the base substrate 10; a gate insulating layer 316 arranged on a side of the base substrate 10 and the active layer 314; a gate electrode (which is a part of the gate line 315) arranged on a surface of the gate insulating layer 316 away from the base substrate 10; an interlayer dielectric layer 317 arranged on a surface of the gate insulating layer 316 and a surface of the gate electrode away from the base substrate 10, where the first via hole 321 penetrates through the gate insulating layer 316 and the interlayer dielectric layer 317; the source-drain electrode layer 313 arranged on a surface of the interlayer dielectric layer 317 away from the base substrate 10; a first planarization layer 41 arranged on a side of the interlayer dielectric layer 317 and the source-drain electrode layer 313 away from the base substrate 10, the second via hole 322 penetrating through the first planarization layer 41; the first wires 51 arranged on a side of the first planarization layer 41 away from the base substrate 10 and each electrically connected to the second connection terminal 3132 through the second via hole 322; a second planarization layer 42 arranged on a side of the first planarization layer 41 and the first wires 51 away from the base substrate 10, the third via hole 23 penetrating through the second planarization layer 42, and each first wire 51 being electrically connected to the anode 221 of the second light emitting unit 22 through the third via hole 23.

As shown in FIG. 3, each second light emitting unit 22 includes the anode 221, a light emitting layer 212, and a cathode 223, and in some implementations, each second light emitting unit 22 may further include an electron transport layer, an electron injection layer, a hole transport layer, a hole injection layer, and the like, which may be flexibly selected by a person skilled in the art according to actual situations.

Figure 4:
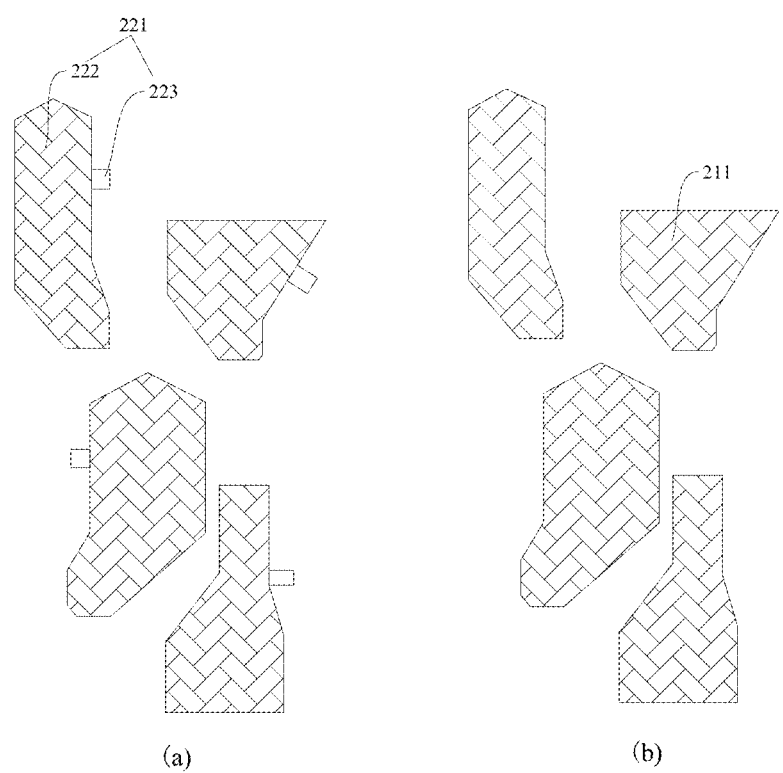
FIG. 4 is a schematic structural diagram illustrating an anode of a first light emitting unit and an anode of a second light emitting unit according to an embodiment of the present disclosure.

According to the embodiment of the present disclosure, referring to FIGS. 2 and (a) of FIG. 4, the anode 221 of each second light emitting unit 22 has a body 222 and a protruding portion 223, each first wire 51 is disposed corresponding to the anode 221 of the second light emitting unit 22, and each first wire 51 is electrically connected to the protruding portion 223 through the second via hole 322. With such configurations, it not only facilitates an electrical connection between the first wire and the anode of the second light emitting unit, but also ensures an effective light emitting efficiency of the second light emitting unit as much as possible. It should be noted that the anode 221 of the second light emitting unit 22 shown in FIG. 2 is only schematic, and is not a structure of an actual product. Moreover, the above-mentioned "the first wire 51 being disposed corresponding to the anode 221 of the second light emitting unit 22" means that one anode 221 is arranged corresponding to each first wire 51, that is, each first wire 51 is only electrically connected to the anode 221 of one second light emitting unit. In addition, a position of the protruding portion 223 with respect to the body 222 is not particularly limited, and those skilled in the art can flexibly select the position of the protruding portion 223 according to actual situations, and for example, the protruding portion 223 may be disposed at any edge peripheral to the body 222.

According to the embodiment of the present disclosure, a distance between a surface of the body of the anode away from the base substrate and a surface of the first wire away from the base substrate is d1, a distance between a surface of the protruding portion away from the base substrate and the surface of the first wire away from the base substrate is d2, a ratio of d1 to d2 ranges from 0.8 to 1.2, it should be noted that a ratio of a thickness of the protruding portion to a thickness of the body of the anode ranges from 0.8 to 1.2, where the thickness of the protruding portion does not include a thickness of a part of the anode in the third via hole 23, referring to FIG. 3, the anode 221 of the second light emitting unit 22 is disposed on a surface of the second planarization layer 42 away from the base substrate, and the thickness of the protruding portion is equal to a distance between the surface of the protruding portion away from the base substrate and a surface of the second planarization layer away from the base substrate. In a manufacturing process, the body and the protruding portion of the anode 221 are manufactured by a single process, i.e., the body and the protruding portion of the anode are formed into one piece, that is, structures of the body and the protruding portion of the anode are unified, but shapes of the body and the protruding portion of the anode are different. In some implementations, the anode 221 includes a first transparent electrode (for example, made of indium tin oxide (ITO)), a silver electrode, and a second transparent electrode (for example, made of ITO) that are stacked, so that each of the body and the protruding portion of the anode is of a structure including the first transparent electrode, the silver electrode, and the second transparent electrode, which are stacked.

According to the embodiment of the present disclosure, a ratio of an area of a light emitting region of the first light emitting unit to an area of a light emitting region of the second light emitting unit ranges from 0.9 to 1.1, it should be noted that the light emitting region refers to a region exposing the anode from an opening defined by a pixel defining layer 43. With such configurations, the light emitting efficiency of the second light emitting unit is better guaranteed. It should be noted that the ratio of the area of the light emitting region of the first light emitting unit to the area of the light emitting region of the second light emitting unit ranging from 0.9 to 1.1 means that a ratio between areas of light emitting regions of light emitting units emitting light of a same color ranges from 0.9 to 1.1, for example, a ratio of an area of a light emitting region of a first red light emitting unit to an area of a light emitting region of a second red light emitting unit ranges from 0.9 to 1.1, a ratio of an area of a light emitting region of a first blue light emitting unit to an area of a light emitting region of a second blue light emitting unit ranges from 0.9 to 1.1, and a ratio of an area of a light emitting region of a first green light emitting unit to an area of a light emitting region of a second green light emitting unit ranges from 0.9 to 1.1.

In some implementations, referring to (a) and (b) of FIG. 4, a shape of the body 222 substantially conforms to a shape of an anode 211 of the first light emitting unit 21 in the first display area. With such configuration, the light emitting efficiency of the second light emitting unit is better guaranteed. Shapes of anodes of different light emitting units may be flexibly designed according to different colors of light emitted by the blue light emitting unit, the red light emitting unit, the green light emitting unit and the like, and will not be described in detail herein. It should be noted that the shape of the body 222 substantially conforming to the shape of the anode 211 of the first light emitting unit 21 in the first display area means that the shape of the body 222 of the anode of the second light emitting unit substantially conforms to the shape of the anode 211 of the first light emitting unit 21 emitting light with the same color as that emitted by the second light emitting unit, for example, the shape of the body of the anode of the second red light emitting unit substantially conforms to the shape of the anode of the first red light emitting unit, the shape of the body of the anode of the second blue light emitting unit substantially conforms to the shape of the anode of the first blue light emitting unit, and the shape of the body of the anode of the second green light emitting unit substantially conforms to the shape of the anode of the first green light emitting unit. According to the embodiment of the present disclosure, referring to FIG. 5, each first pixel circuit further includes a fourth via hole 311 and a fifth via hole 312, where the fourth via hole 311 is configured to electrically connect the source-drain electrode layer 313 in the first pixel circuit 31 with the anode 211 of the first light emitting unit 21, the fifth via hole 312 is configured to electrically connect the source-drain electrode layer 313 in the first pixel circuit with the active layer 314 in the first pixel circuit, and an orthographic projection of the fourth via hole 311 on the base substrate 10 overlaps an orthographic projection of the fifth via hole 312 on the base substrate 10. Each first light emitting unit 21 includes the anode 211, the light emitting layer 212 and a cathode 213, and in some implementations, each first light emitting unit 21 may further include an electron transport layer, an electron injection layer, a hole transport layer, a hole injection layer, and the like, which may be flexibly selected by a person skilled in the art according to actual situations.

Figure 6:
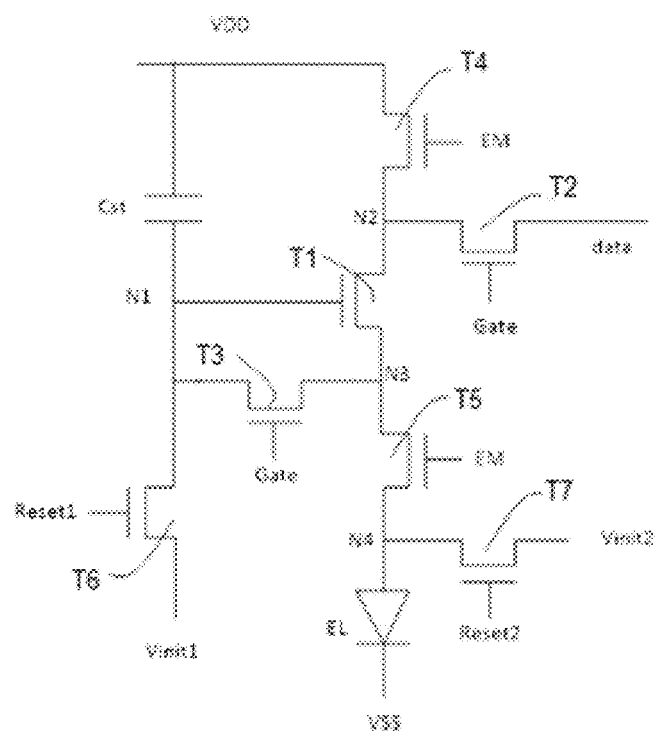
FIG. 6 is a schematic diagram of a pixel circuit according to an embodiment of the present disclosure.

According to the embodiment of the present disclosure, each first pixel circuit and/or second pixel circuit may be of a 7T1C structure (i.e., including seven transistors and one capacitor), for example, may include a driving transistor T1, a data writing transistor T2, a storage capacitor, a threshold compensating transistor T3, a first reset transistor T6, a second reset transistor T7, a first light emitting control transistor T4, and a second light emitting control transistor T5. FIG. 6 shows a principle of circuit driving of a sub-pixel, firstly, the first reset transistor T6 is turned on by a reset signal of a first reset control signal line Reset1, and a signal of a first reset power terminal Vinit1 resets a node N1 at a terminal of the storage capacitor Cst; then, the threshold compensating transistor T3 and the data writing transistor T2 are turned on by a signal Gate (i.e., gate signal), and the driving transistor T1 is turned on due to the signal of the first reset power terminal Vinit1, so that a signal data (i.e., data signal) charges the node N1, and simultaneously, a signal of a second reset power terminal Reset2 controls the second reset transistor T7 to be turned on, so as to reset a current of an OLED device; finally, the first light emitting control transistor T4 and the second light emitting control transistor T5 are turned on by a signal of a light emitting control signal line EM, so that a current flows to a VSS terminal from a VDD terminal through the OLED device, and a magnitude of the current is controlled by a gate voltage (i.e., voltage at the node N1) of the driving transistor T1, where a node N4 in FIG. 6 corresponds to a position of the second via hole 322.

Structures of the first pixel circuit and the second pixel circuit are described in detail below according to some implementations of the present disclosure.

Figure 5:
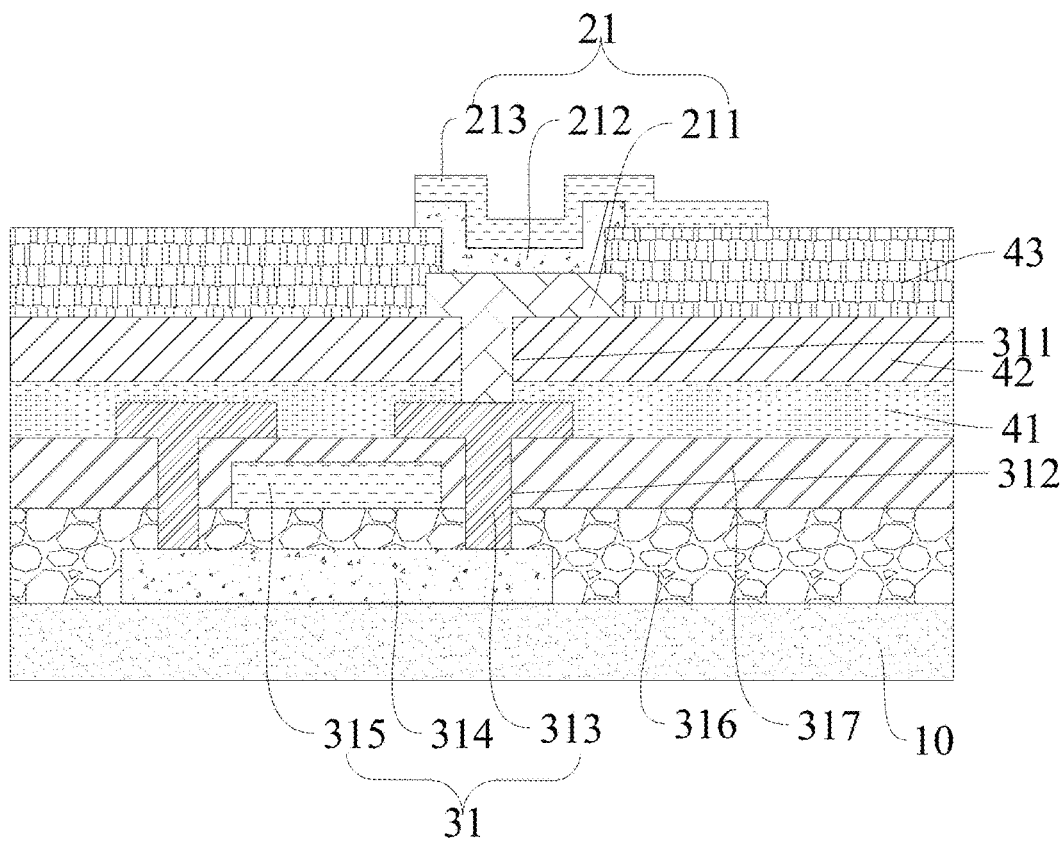
FIG. 5 is a schematic structural diagram of a display panel according to an embodiment of the present disclosure.
Figure 7:
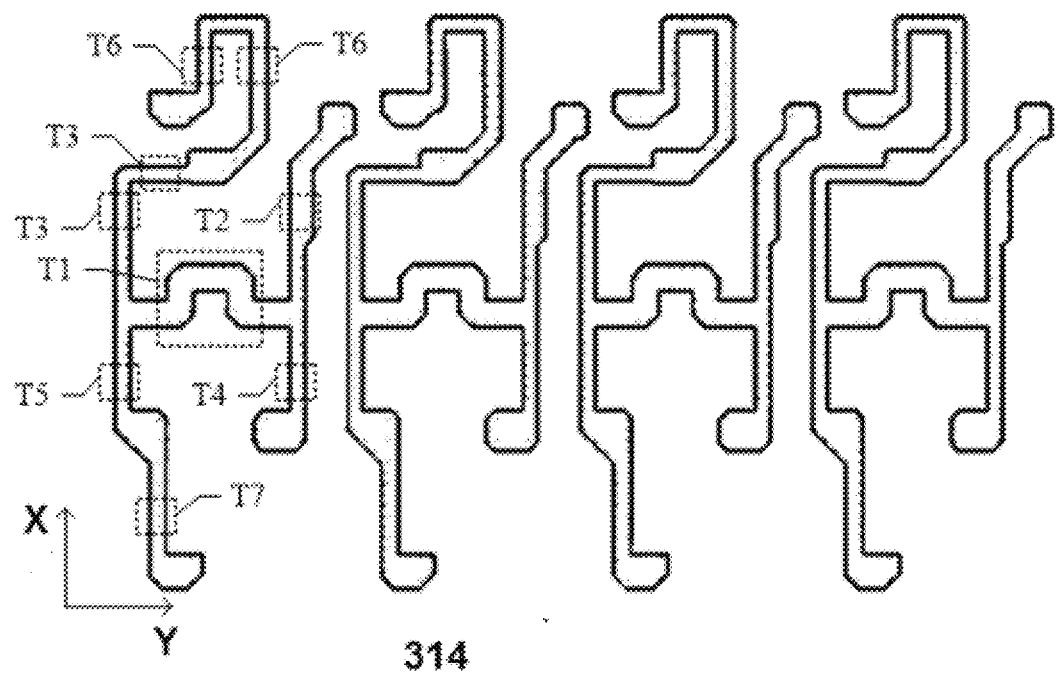
FIG. 7 is a schematic plan view of an active layer according to an embodiment of the present disclosure.

FIG. 7 is a schematic structural diagram of the active layer 314, and as shown in FIG. 7, in some implementations, the active layer 314 includes active layers of the driving transistor T1, the data writing transistor T2, the threshold compensating transistor T3, the first light emitting control transistor T4, the second light emitting control transistor T5, the first reset transistor T6, and the second reset transistor T7. The active layer 314 includes active layer patterns (i.e., channel regions) and doped region patterns (i.e., source and drain doped regions) of transistors in each sub-pixel, and the active layer patterned and the doped region patterns of the transistors in each pixel circuit (i.e., a same pixel circuit) are formed into one piece. It should be noted that dotted rectangular frames in FIG. 5 show portions of the active layer 314 overlapping with gate electrodes of the transistors in the pixel circuit, which serve as channel regions of the transistors.

Figure 8:
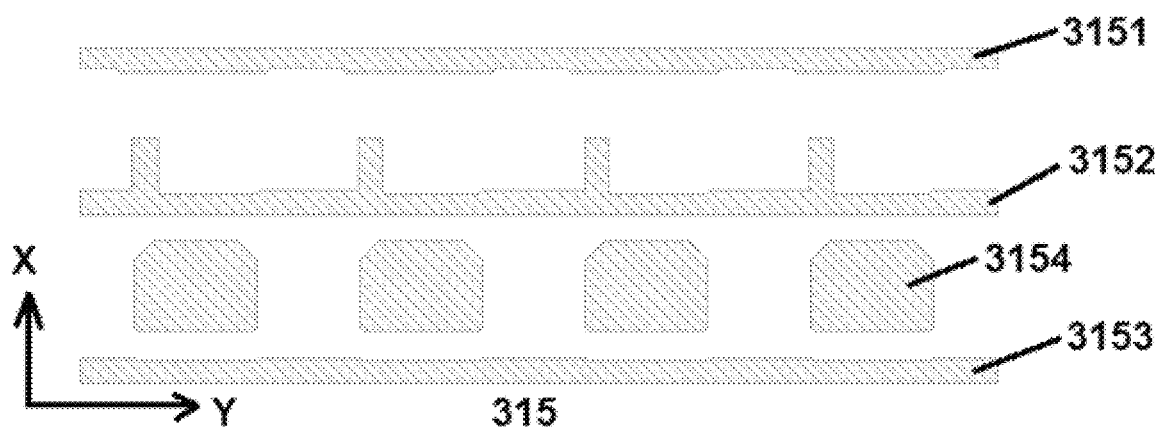
FIG. 8 is a schematic plan view of a gate line according to an embodiment of the present disclosure.

In some implementations, as shown in FIG. 8, the gate line 315 extends in the second direction Y. Further, the gate line 315 includes a reset control signal line (Rst) 3151, a scan signal line (Ga) 3152, and a light emitting control signal line (EM) 3153, and an orthographic projection of the second via hole 322 on the base substrate overlaps an orthographic projection of the scan signal line 3152 on the base substrate 10.

In the first direction X, the reset control signal line (Rst) 3151, the scan signal line (Ga) 3152, and the light emitting control signal line (EM) 3153 are repeatedly arranged. The "second via hole 322" in "the orthographic projection of the second via hole 322 on the base substrate overlapping the orthographic projection of the scan signal line 3152 on the base substrate 10" refers to the second via hole 322 in the second pixel circuit controlled by the scan signal line 3152.

A second electrode 3154 of the storage capacitor (i.e., the gate electrode of the driving transistor T1) is disposed in the same layer as the gate line 315, and the second electrode 3154 of the storage capacitor is located between the scan signal line 3152 and the light emitting control signal line 3153.

Figure 9:
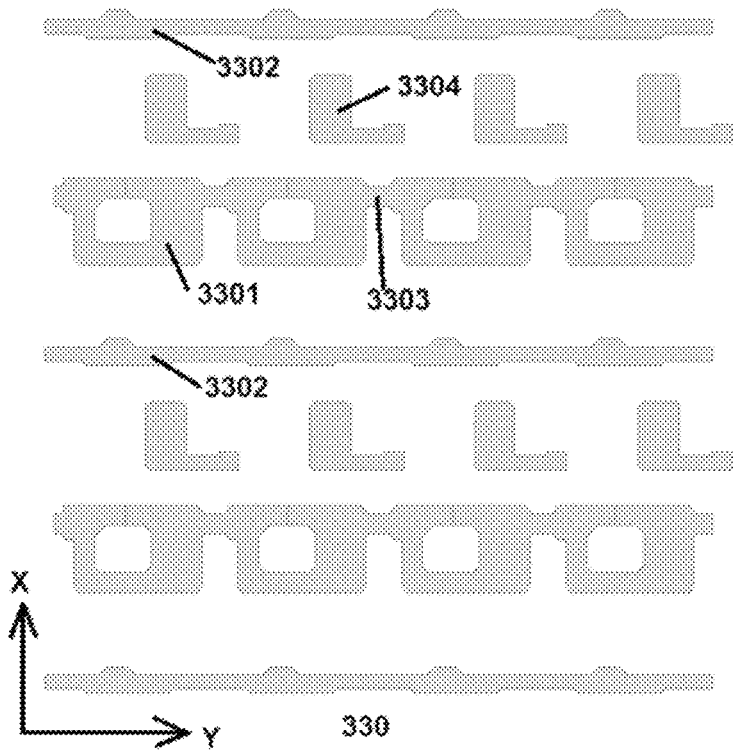
FIG. 9 is a schematic plan view of a conductive layer according to an embodiment of the present disclosure.

In some implementations, the first pixel circuit and the second pixel circuit each may further include a conductive layer 330, the conductive layer 330 is disposed on a side of the gate line away from the base substrate and is insulated from the gate line 315, FIG. 9 shows a schematic structural diagram of the conductive layer 330, as shown in FIG. 9, the conductive layer 330 includes a first electrode 3301 of the storage capacitor, a reset power signal line (Init) 3302, a second power signal line (VDD2) 3303, and a light blocking portion 3304. The first electrode 3301 of the storage capacitor and the second power signal line 3303 may be formed into one piece, and a plurality of first power signal lines (VDD1) (described later) each extending in the first direction X are connected through the second power signal line 3303 and the first electrode 3301 of the storage capacitor, thereby forming a grid wiring to reduce resistance. The first electrode 3301 of the storage capacitor at least partially overlaps the second electrode 3154 of the storage capacitor to form the storage capacitor.

Figure 10:
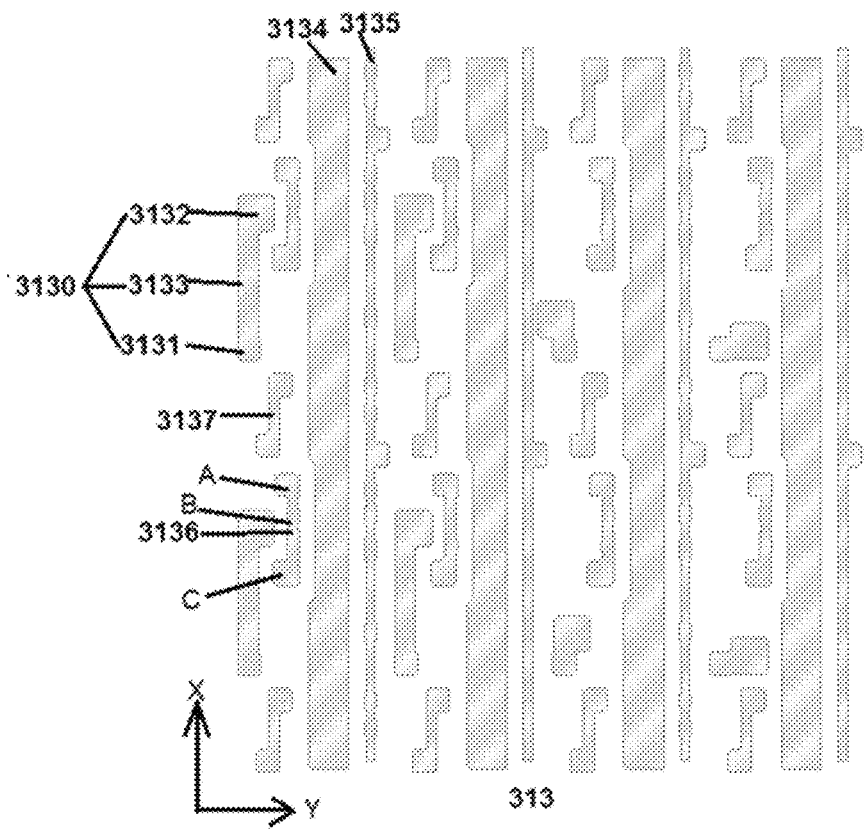
FIG. 10 is a schematic plan view of a structure of a source-drain electrode layer according to an embodiment of the present disclosure.

In some implementations, referring to FIG. 10, the source-drain electrode layer 313 includes, in addition to the drain electrode 3130 described above, a data line (Vd) 3134, a first power signal line VDD1 (3135), a first connection portion 3136, and a second connection portion 3137, where the data line Vd and the first power signal line VDD1 each extend in the first direction X. In some implementations, the connection body 3133 of the drain electrode 3130 extends along the first direction X (as shown in FIG. 2), thereby facilitating better layout of the first wires 51 in a limited space.

Figure 11:
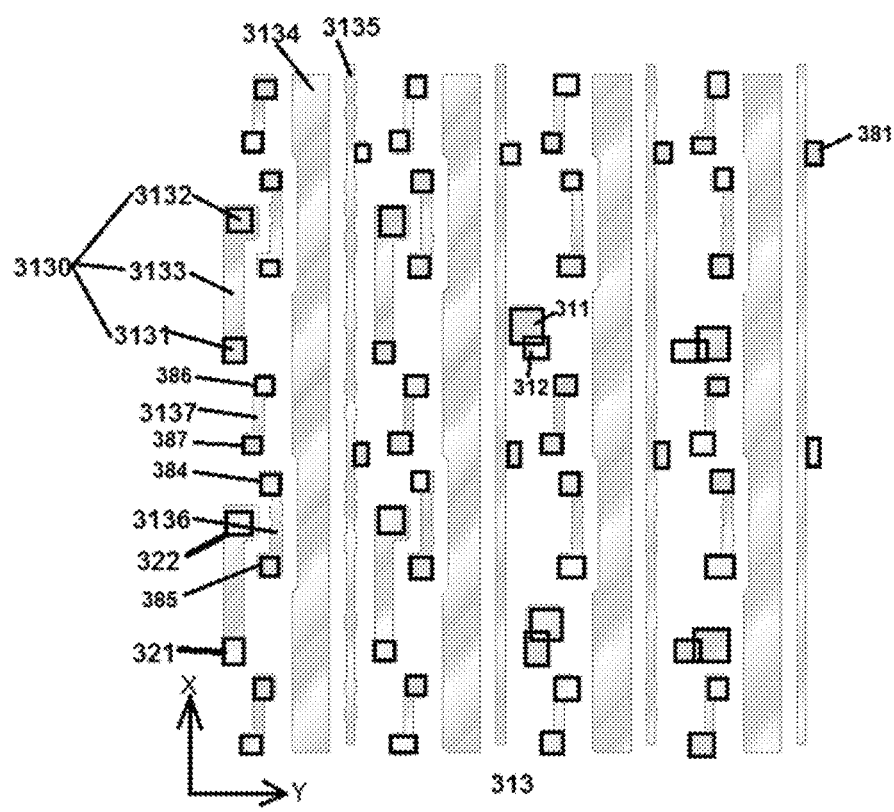
FIG. 11 is a schematic plan view of a structure of a source-drain electrode layer according to an embodiment of the present disclosure.

FIG. 11 shows exemplary positions of a plurality of via holes, and the source-drain electrode layer 313 is connected with a plurality of film layers located between the source-drain electrode layer 313 and the base substrate through the via holes shown, such as the first via hole 321, the second via hole 322, the fourth via hole 311, the fifth via hole 312, a sixth via hole 381, a seventh via hole 384, an eighth via hole 385, an ninth via hole 386, and a tenth via hole 387. The first via hole 321 is configured to electrically connect the first connection terminal 3131 of the drain electrode 3130 with the active layer 314 in the second pixel circuit 32; the second via hole 322 is configured to electrically connect the first wire 51 with the second connection terminal 3132 of the drain electrode 3130; the fourth via hole 311 is configured to electrically connect the source-drain electrode layer 313 in the first pixel circuit 31 with the anode 211 of the first light emitting unit 21; the fifth via hole 312 is configured to electrically connect the source-drain electrode layer 313 in the first pixel circuit and the active layer 314 in the first pixel circuit; the sixth via hole 381 is configured to electrically connect the data writing transistor T2 with the data line Vd; the seventh via hole 384 is configured to electrically connect a first terminal A of the first connection portion 3136 of the source-drain electrode layer 313 with the threshold compensating transistor T3, and the first connection portion 3136 is configured to connect a source/drain electrode of the threshold compensating transistor T3 with a source/drain electrode of the driving transistor T1; the eighth via hole 385 is configured to electrically connect a second terminal B of the first connection portion 3136 with the gate electrode of the driving transistor T1; the ninth via hoe 386 is configured to electrically connect a terminal of the second connection portion 3137 with the reset power signal line Init 3302; the tenth via hole 387 is configured to electrically connect another terminal of the second connection portion 3137 with a first electrode of the second reset transistor T7, where the first electrode of the second reset transistor T7 is configured to be electrically connected with the second reset power terminal Vinit2 to receive a second reset signal.

According to the embodiment of the present disclosure, as shown in FIGS. 10 and 11, an orthographic projection of the second connection terminal 3132 in the second direction Y overlaps an orthographic projection of a middle body C of the first connection portion 3136 in the second direction Y.

A schematic diagram of the active layer 314, the gate line 315, the conductive layer 330, and the source-drain electrode layer 313 stacked as described above may be referred to FIG. 12 (insulating layers between structures of the layers are not shown).

Figure 12:
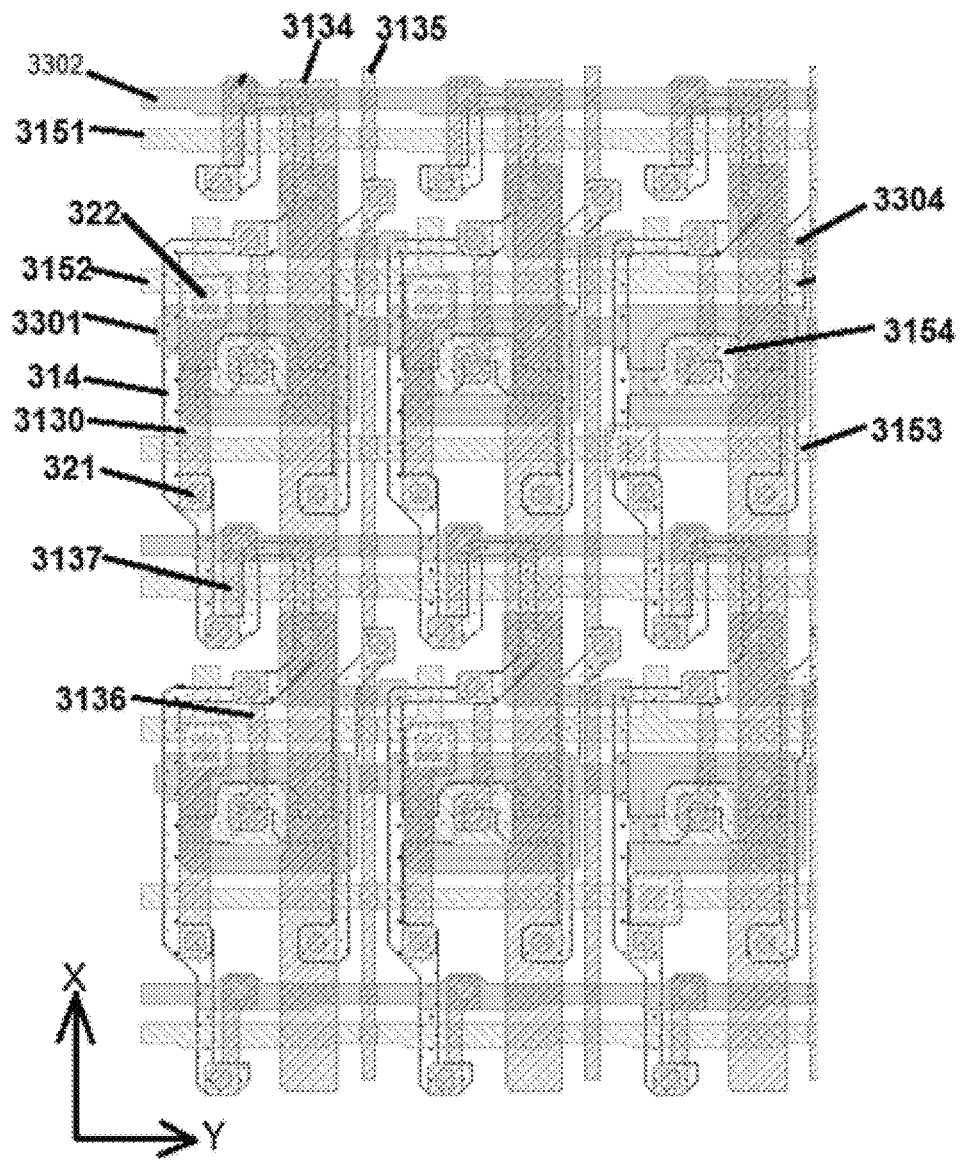
FIG. 12 is a schematic plan view of a partial structure of a display panel according to an embodiment of the present disclosure.

According to the embodiment of the present disclosure, referring to FIG. 12, an orthographic projection of the connection body 3130 on the base substrate overlaps an orthographic projection of the storage capacitor (i.e., a region where the second electrode 3154 and the first electrode 3301 overlap) on the base substrate.

Figure 13:
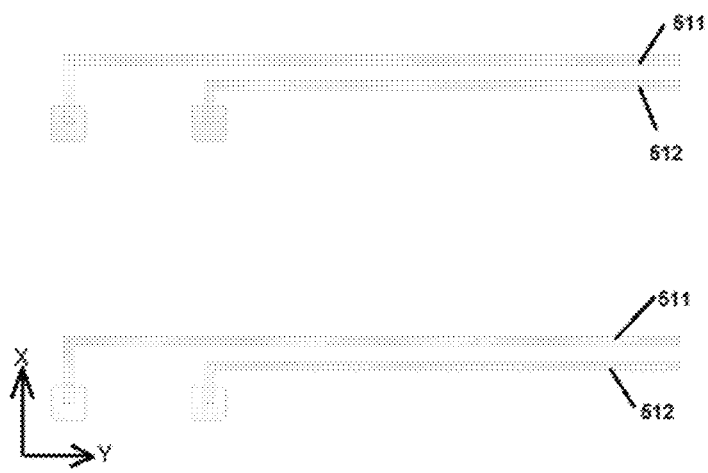
FIG. 13 is a schematic plan view of a structure of a first wire according to an embodiment of the present disclosure.
Figure 14:
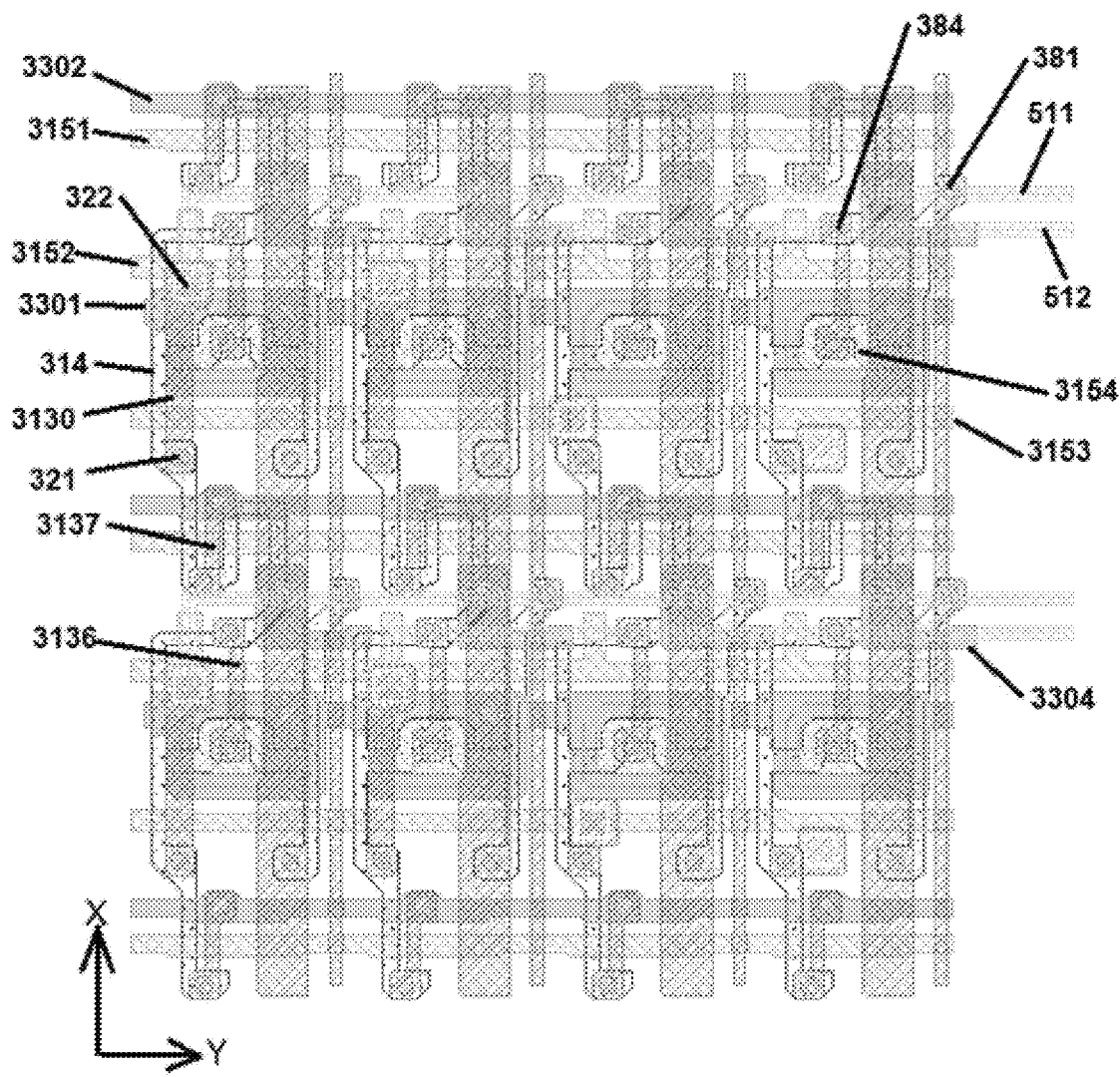
FIG. 14 is a schematic plan view of a partial structure of a display panel according to an embodiment of the present disclosure.

According to the embodiment of the present disclosure, referring to FIGS. 13, 14 and 2, each first wire 51 includes a first sub-wire 511 and a second sub-wire 512 in the first direction X, and orthographic projections of the first sub-wire 511 and the second sub-wire 512 on the base substrate do not overlap the orthographic projection of the connecting body 3130 on the base substrate, referring to FIG. 13, the first sub-wire 511 and the second sub-wire 512 each extend in the second direction Y. That is, as shown in FIGS. 13 and 14, the orthographic projection of the connection body 3130 in the second pixel circuit electrically connected to the first sub-wire 511 on the base substrate does not overlap the orthographic projections of the first sub-wire 511 and the second sub-wires 512 on the base substrate.

According to the embodiment of the present disclosure, referring to FIG. 14, the orthographic projection of the first sub-wire 511 on the base substrate overlaps an orthographic projection of the sixth via hole 381 on the base substrate, the sixth via hole 381 is configured to electrically connect the data writing transistor T2 with the data line 3134; the orthographic projection of the second sub-wire 512 on the base substrate overlaps an orthographic projection of the seventh via hole 384 on the base substrate, the seventh via hole 384 is configured to electrically connect the first terminal A of the first connection portion 3136 in the source-drain electrode layer 313 with the threshold compensating transistor T3, and the first connection portion 3136 is configured to connect the source/drain electrode of the threshold compensating transistor T3 with the source/drain electrode of the driving transistor T1.

According to the embodiment of the present disclosure, as shown in FIG. 2, each first wire 51 further includes a third sub-wire 513 in the first direction X, and an orthographic projection of the third sub-wire 513 on the base substrate overlaps the orthographic projection of the connection body 3136 on the base substrate. As shown in FIG. 2, the third sub-wire 513 is electrically connected to the second connection terminal 3132 of the connection body 3130, is bent toward the first connection terminal 3131, extends toward the second display area b, and is electrically connected to the anode of the second light emitting unit. In some implementations, the orthographic projection of the third sub-wire 513 on the base substrate overlaps an orthographic projection of the eighth via hole 385 on the base substrate, and the eighth via hole 385 is configured to electrically connect the second terminal B of the first connection portion 3136 with the gate electrode of the driving transistor T1.

It should be noted that each first wire 51 includes not only the first sub-wire 511, the second sub-wire 512, and the third sub-wire 513, but also a plurality of other sub-wires, and those skilled in the art can flexibly arrange a mode of wiring of the sub-wires according to actual design expectations.

According to the embodiment of the present disclosure, the first wires may be made of ITO or indium zinc oxide (IZO). With such configuration, since these materials each have a good conductivity, high light transmittance, the light transmittance of the second display area can be improved.

Figure 15:
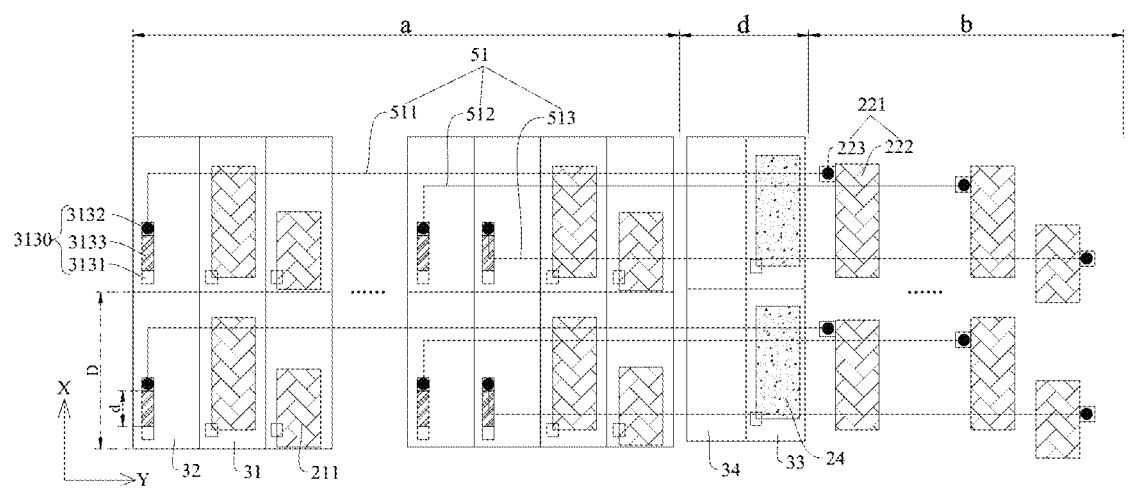
FIG. 15 is a schematic plan view of a partial structure of a display panel according to an embodiment of the present disclosure.

According to the embodiment of the present disclosure, referring to FIG. 15, a transition display area d is disposed between the first display area a and the second display area b, the transition display area d is provided therein with a third pixel circuit 33, a third light emitting unit 24 and a fourth pixel circuit 34, the third pixel circuit is configured to drive the third light emitting unit to emit light, as shown in FIG. 15, no light emitting unit is provided in a pixel region corresponding to the fourth pixel circuit 34, and the fourth pixel circuit 34 is not electrically connected with the anode 221 of the second light emitting unit in the second display area b.

Figure 16:
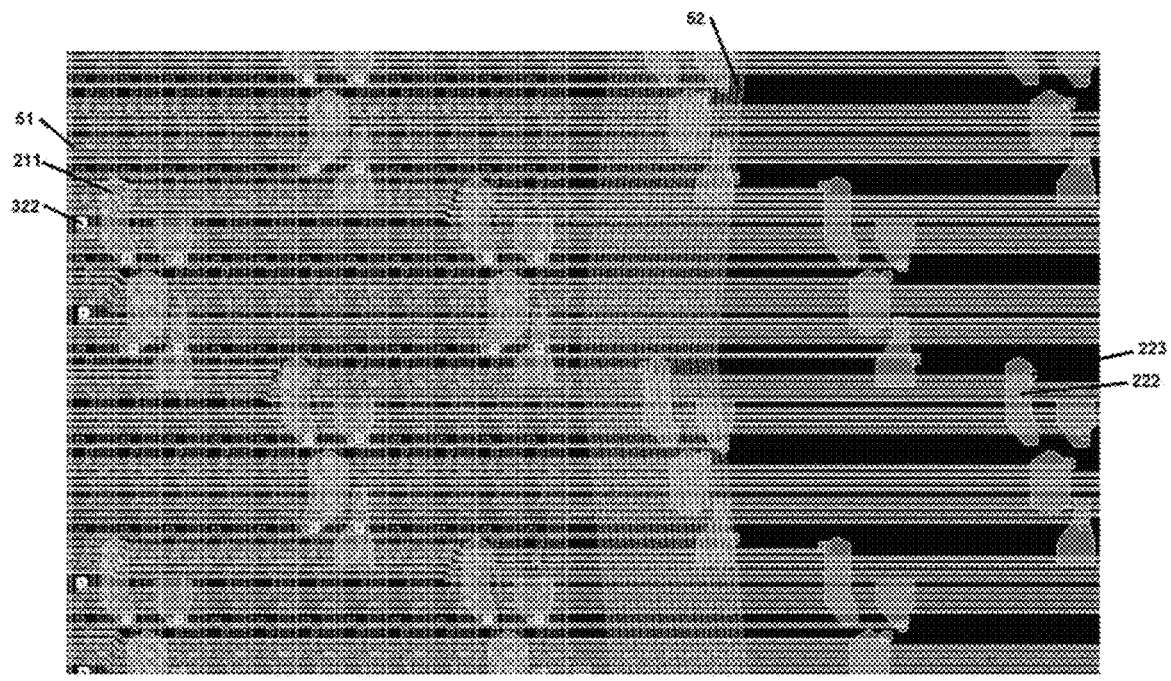
FIG. 16 is a schematic plan view of a partial structure of a display panel according to an embodiment of the present disclosure.

Further, referring to FIG. 16, a plurality of second wires 52 are disposed at an edge of the second display area b close to the transition display area d, and the second wires 52 are disposed in the same layer as the source-drain electrode layer and configured to transmit the reset signal and a charging signal in the first display area. With such configurations, the display effect of the display panel is better ensured.

Figure 17:
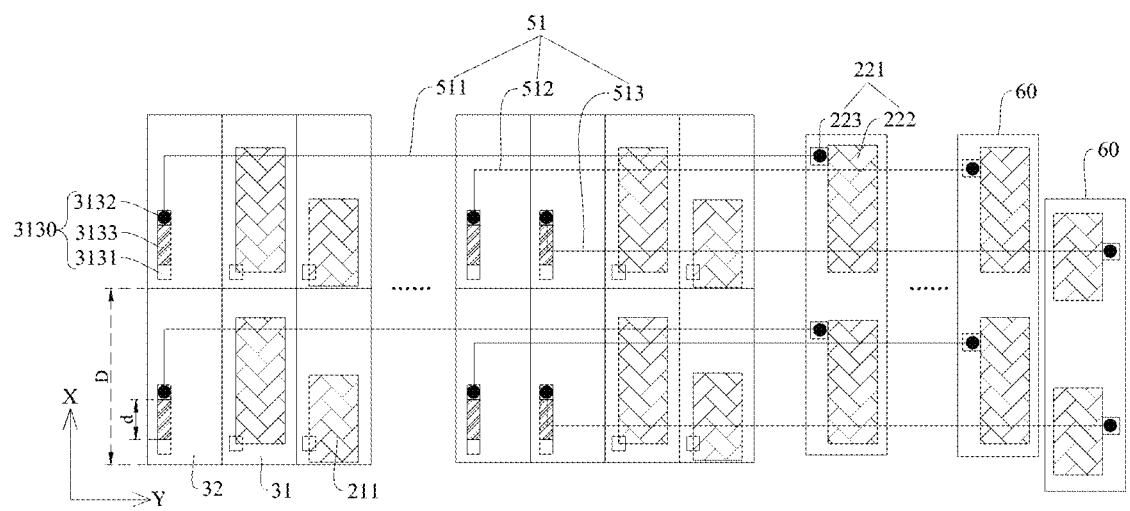
FIG. 17 is a schematic plan view of a partial structure of a display panel according to an embodiment of the present disclosure.

According to the embodiment of the present disclosure, referring to FIG. 17, a plurality of patterned cathode layers 60 are provided in the second display area b, and an orthographic projection of each of the patterned cathode layers 60 on the base substrate covers an orthographic projection of the anode 221 of at least one of the second light emitting units on the base substrate. That is, the cathode 213 of the second light emitting unit is one of the patterned cathode layers 60, rather than a structure of an entire layer of cathode, so that a coverage area of the cathode can be reduced, and the light transmittance of the second display area can be improved.

The number of anodes of the second light emitting units covered by each patterned cathode layer is not particularly limited, and may be flexibly designed by a person skilled in the art according to actual situations. For example, in some implementations, each patterned cathode layer 60 covers one anode 221; and in some implementations, each patterned cathode layer covers two or three anodes 221.

According to the embodiment of the present disclosure, cathodes of the light emitting units in the first display area a and the transition display area d are formed into one piece in a same layer, that is, the cathodes of the light emitting units in the first display area a and the transition display area d are formed into a structure of an entire layer, rather than patterned cathode layers. In addition, in a case where the display area of the display panel includes the third display area c, cathodes of light emitting units in the first display area a, the third display area c and the transition display area d are formed into one piece in a same layer, that is, the cathodes in the display areas except the second display area b are formed into one piece in an entire layer, and no patterning is to be performed.

Figure 18:
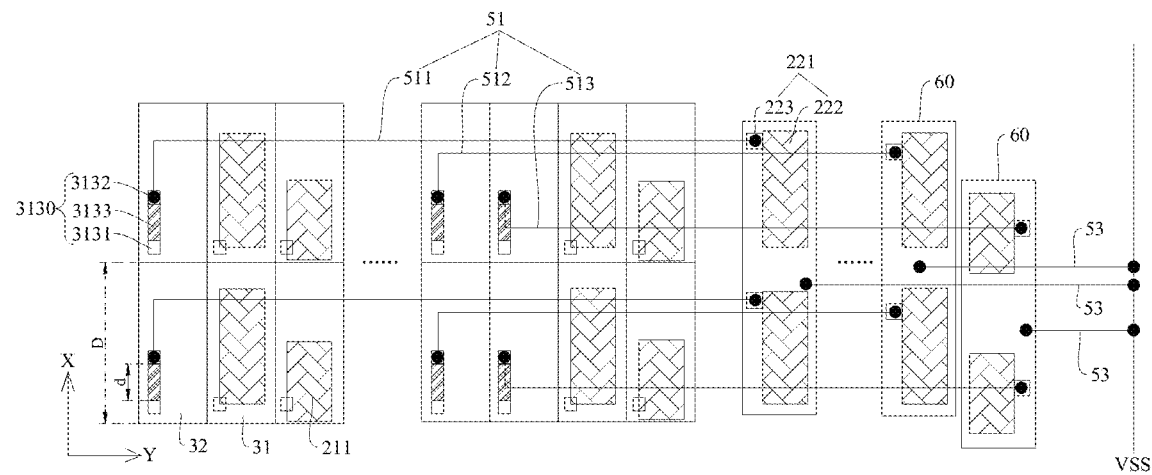
FIG. 18 is a schematic plan view of a partial structure of a display panel according to an embodiment of the present disclosure.

According to the embodiment of the present disclosure, referring to FIG. 18, the display panel further includes a plurality of third wires 53, the third wires 53 are disposed in the same layer as the first wires 51, each of the patterned cathode layers 60 is provided corresponding to one of the third wires 53, and each of the third wires 53 is configured to electrically connect the patterned cathode layer 61 corresponding thereto with a VSS signal line. Therefore, the patterned cathode layer in each second light emitting unit is ensured to be electrically connected with the VSS signal line.

According to the embodiment of the present disclosure, the third wires may be made of ITO or IZO. With such configuration, since these materials each have a good conductivity, high light transmittance, the light transmittance of the second display area can be better improved.

Figure 19:
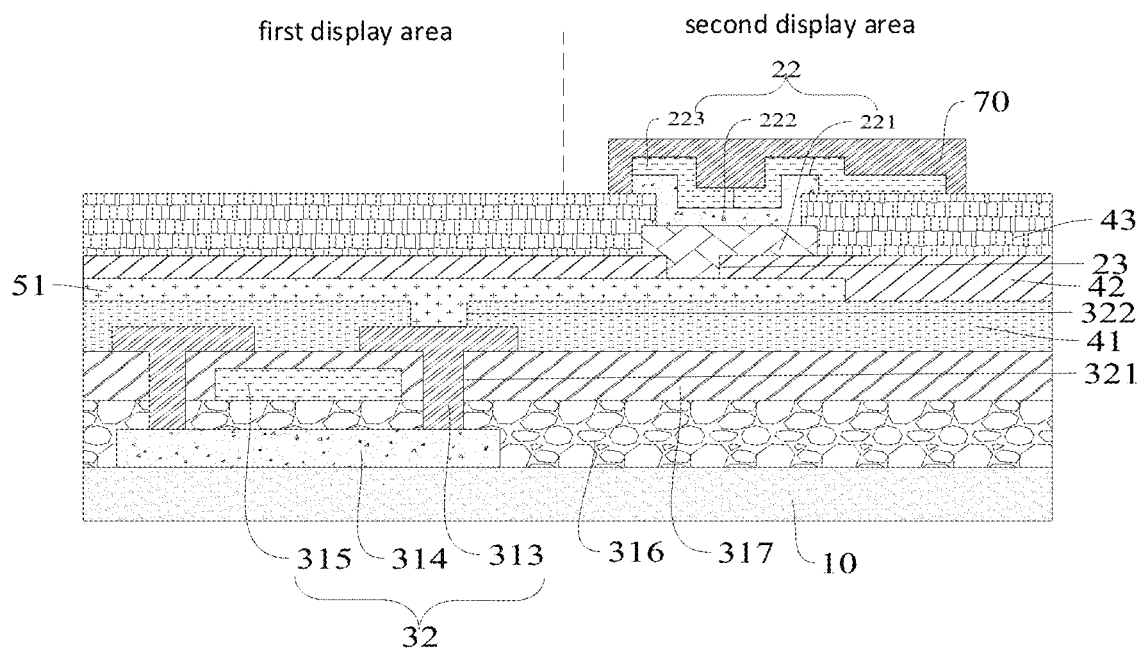
FIG. 19 is a schematic structural diagram of a display panel according to an embodiment of the present disclosure.

According to the embodiment of the present disclosure, referring to FIG. 19, the display panel further includes a plurality of package sub-layers 70 disposed at intervals, the package sub-layers 70 are disposed in correspondence with the patterned cathode layers 60 one to one (that is, each package sub-layer is disposed in correspondence with one patterned cathode layer), and an orthographic projection of each package sub-layer 70 on the base substrate 10 covers an orthographic projection of one patterned cathode layer 60 on the base substrate 10.

In another aspect, the present disclosure provides a method for manufacturing the display panel as described above. According to an embodiment of the present disclosure, as shown in FIG. 1, the display panel includes a first display area a and a second display area b, the first display area a is disposed on a side of the second display area b, and the second display area b is disposed opposite to an under display camera, where the second display area b being disposed opposite to the under display camera means that an orthographic projection of the under display camera on the display panel completely overlaps the second display area b, or the orthographic projection of the under display camera on the display panel covers the second display area b, or the orthographic projection of the under display camera on the display panel is covered by the second display area b.

In addition, as shown in FIG. 1, the display panel further includes a third display area c, and the third display area c is located on a side of the first display area a away from the second display area b. Compared with the first display area and the second display area, the third display area is a display area with a relatively high PPI (indicating a pixel density), i.e., the PPI of the third display area is greater than that of the first display area and that of the second display area.

Referring to FIGS. 2 and 3, the method for manufacturing the display panel includes following steps S100 to S400.

At step S100, providing a base substrate 10.

At step S200, forming a plurality of second pixel circuits 32, a plurality of first pixel circuits 31, and a plurality of first light emitting units 21 in a region of the base substrate 10 corresponding to the first display area a, where the second pixel circuits 32 and the first pixel circuits 31 are arranged along a first direction X and a second direction Y, the first pixel circuits 31 are configured to drive the first light emitting units 21 to emit light, the first direction X intersects the second direction Y, and forming the second pixel circuits 32 and the first pixel circuits 31 includes forming an active layer 314, a source-drain electrode layer 313, a gate line 315, and a storage capacitor.

During forming the second pixel circuits, a first via hole 321 and a second via hole 322 are further formed, the source-drain electrode layer 313 in the second pixel circuit 32 includes a drain electrode 3130, the drain electrode 3130 has a first connection terminal 3131, a second connection terminal 3132 and a connection body 3133 connecting the first connection terminal 3131 and the second connection terminal 3132, where the first via hole 321 is configured to electrically connect the first connection terminal 3131 with the active layer 314 in the second pixel circuit 32, the connection body 3133 extends along the first direction X, a length of the connection body 3133 is greater than or equal to a length of the storage capacitor in the first direction X. The gate line 315 extends along the second direction Y, the gate line 315 includes a reset control signal line (Rst) 3151, a scan signal line (Ga) 3152 and a light emitting control signal line (EM) 3153, an orthograph projection of the second via hole 322 on the base substrate overlaps an orthograph projection of the scan signal line 3152 on the base substrate 10 (as shown in FIG. 8).

At step S300, forming a plurality of first wires 51 on a side of the source-drain electrode layer 313 away from the base substrate 10, each first wire 51 being electrically connected with the second connection terminal 3132 through the second via hole 322.

At step S400, forming a plurality of second light emitting units 22 in a region of the base substrate 10 corresponding to the second display area b, the second pixel circuits 32 being configured to drive the second light emitting units 22 to emit light, where each first wire 51 is electrically connected to the anode 221 of the second light emitting unit 22 through the third via hole 23 in the second display area, so as to drive the second light emitting unit 22 to emit light. A structure of the display panel manufactured by the method described above may refer to FIG. 2 and FIG. 3, and it should be noted that in the method described above, only steps for forming structures such as the active layer, the gate line, the source-drain electrode layer, the first wires, the first light emitting units are described, but insulating layers are further formed between these structures.

According to the embodiment of the disclosure, in the method described above, the drain electrode of above-mentioned structure and a position of connection between the first wire and the drain electrode facilitate to optimizing an arrangement of the first wires, and thus can reduce an area of the anode of the second light emitting unit electrically connected with the first wire, and can further improve the light transmittance of the second display area d, so as to increase an amount of incoming light of the under display camera, and improve the photographing effect of the under display camera; moreover, the method described above has mature processes, is easy to be implemented and is convenient for industrial production.

FIG. 3 shows a schematic structural diagram of the display panel manufactured by the method described above, and as shown in FIG. 3, in some implementations, the display panel includes: the base substrate 10; the active layer 314 arranged on a side of the base substrate 10; the gate insulating layer 316 arranged on a surface of the base substrate 10 and covering the active layer 314; the gate electrode (which is a part of the gate line 315) arranged on a surface of the gate insulating layer 316 away from the base substrate 10; the interlayer dielectric layer 317 arranged on a surface of the gate insulating layer 316 away from the base substrate 10 and covering the gate electrode, where the first via hole 321 penetrates through the gate insulating layer 316 and the interlayer dielectric layer 317; the source-drain electrode layer 313 arranged on a surface of the interlayer dielectric layer 317 away from the base substrate 10; the first planarization layer 41 arranged on a side of the interlayer dielectric layer 317 away from the base substrate 10 and covering the source-drain electrode layer 313, the second via hole 322 penetrating through the first planarization layer 41; the first wires 51 arranged on a side of the first planarization layer 41 away from the base substrate 10, each first wire 51 being electrically connected to the second connection terminal 3132 through the second via hole 322; the second planarization layer 42 arranged on a side of the first planarization layer 41 away from the base substrate 10 and covering the first wires 51, the third via hole 23 penetrating through the second planarization layer 42, and each first wire 51 being electrically connected to the anode 221 of the second light emitting unit 22 through the third via hole 23.

According to the embodiment of the present disclosure, referring to FIGS. 2 and (a) of FIG. 4, the anode 221 of the second light emitting unit 22 is formed by etching, the anode 221 includes a body 222 and a protruding portion 223, and each first wire 51 is electrically connected to the protruding portion 223 through the second via hole 322. With such configurations, it not only facilitates an electrical connection between the first wire and the anode of the second light emitting unit, but also ensures an effective light emitting efficiency of the second light emitting unit as much as possible. It should be noted that the anode 221 of the second light emitting unit 22 shown in FIG. 2 is only schematic, and is not a structure of an actual product. In addition, a position of the protruding portion 223 with respect to the body 222 is not particularly limited, and may be flexibly selected by those skilled in the art according to actual situations, and the protruding portion 223 may be disposed at any edge peripheral to the body 222.

According to the embodiment of the present disclosure, referring to (a) and (b) of FIG. 4, a shape of the body 222 conforms with a shape of the anode 211 of the first light emitting unit 21 in the first display area. With such configuration, the light emitting efficiency of the second light emitting unit can be better guaranteed. Shapes of anodes of different light emitting units may be flexibly designed according to different colors of light emitted by a blue light emitting unit, a red light emitting unit, a green light emitting unit and the like, and will not be described in detail herein.

According to the embodiment of the present disclosure, referring to FIG. 17, the method for manufacturing the display panel further includes: patterning the cathode in the second display area b to obtain a plurality of patterned cathode layers 60, where an orthographic projection of each patterned cathode layer 60 on the base substrate covers an orthographic projection of the anode 221 of at least one of the second light emitting units 22 on the base substrate. That is to say, the cathode 213 of the second light emitting unit is the patterned cathode layer 60, rather than a structure of an entire layer of cathode, so that a coverage area of the cathode can be reduced, and the light transmittance of the second display area can be improved; moreover, the method described above is simple and easy to be implemented, has mature processes and is convenient for industrial production.

In another aspect, the present disclosure provides a display device. According to an embodiment of the present disclosure, referring to FIG. 20, the display device 1 includes: the display panel 1000 described above, or the display panel 1000 manufactured by the method described above; an under display camera 2000, which is provided on a back of the display panel 1000 (i.e., the under display camera 2000 is provided on a side of the display panel away from a display side of the display panel), an orthographic projection of the under display camera on the display panel overlaps the second display area b of the display panel. With such configurations, the under display camera in the display device can receive desired incoming light, and the shooting quality of the under display camera can be effectively improved. It will be understood by those skilled in the art that the display device has all the features and advantages of the display panel described above, which will not be described herein in detail.

Figure 20:
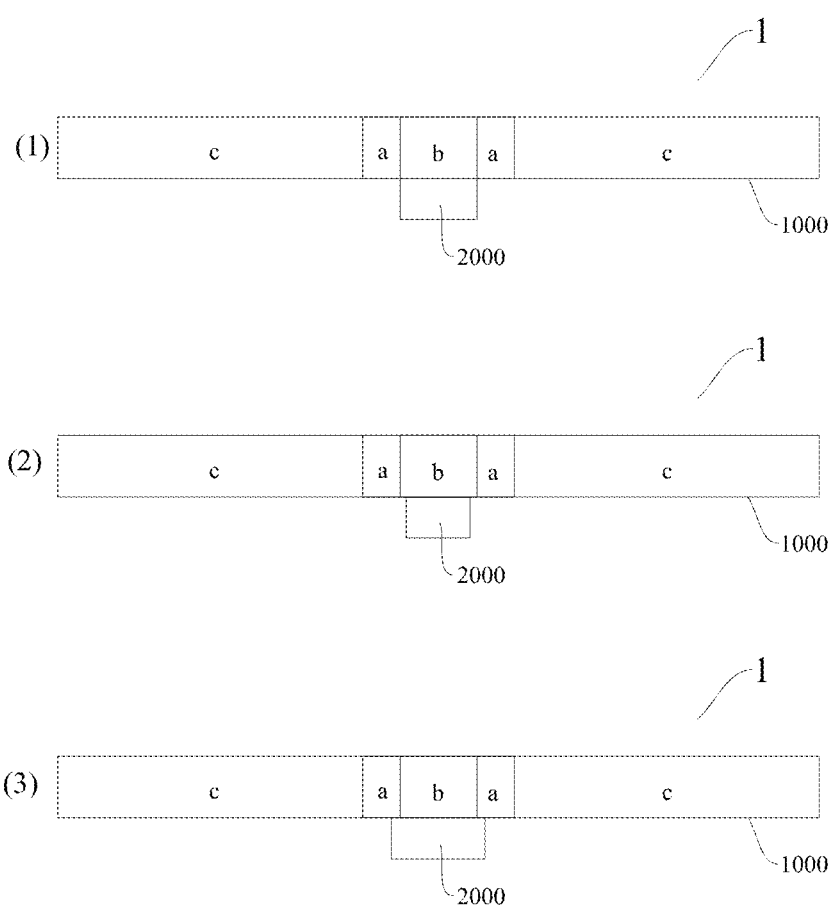
FIG. 20 is a schematic structural diagram of a display device according to an embodiment of the present disclosure.

The orthographic projection of the under display camera 2000 on the display panel overlapping the second display area b of the display panel may include following three cases: in a first case, the orthographic projection of the under display camera 2000 on the display panel overlaps the second display area b of the display panel, as shown in (1) of FIG. 20; in a second case, the orthographic projection of the under display camera 2000 on the display panel is covered by the second display area b of the display panel, as shown in (2) of FIG. 20; and in a third case, the orthographic projection of the under display camera 2000 on the display panel covers the second display area b of the display panel, as shown in (3) of FIG. 20.

According to the embodiment of the present disclosure, a type of the display device is not particularly limited, and those skilled in the art may flexibly select the display device according to actual situations, for example, the display device includes, but is not limited to, a mobile phone, a tablet, a notebook computer, or any other device having display and camera shooting functions.

The terms "first" and "second" are used herein for descriptive purposes only and are not to be construed as indicating or implying relative importance or to implicitly indicate the number of technical features indicated. Thus, any feature defined by "first" or "second" may explicitly or implicitly indicate that one or more of the features are included. In the description of the present disclosure, "a plurality of" means two or more, unless limited otherwise.

In the present disclosure, unless otherwise explicitly stated or limited, the terms "mounted", "connected", "coupled", "fixed," and the like should be construed broadly, e.g., may be fixedly connected, detachably connected, or connected into one piece; may be mechanically or electrically connected; may be directly connected or indirectly connected through intervening media; may indicate an internal connection of two components or an interaction between two components. The meaning of above terms in the present disclosure may be understood according to actual situations by a person of ordinary skill in the art.

In the description of the present disclosure, the description with reference to "an embodiment", "the embodiment", "an example", "examples", "some implementations" or the like means that a particular feature, structure, material, or characteristic described in connection with the embodiment, implementation or example is included in at least one embodiment, implementation or example of the present disclosure. In this specification, the schematic representations of the terms mentioned above are not necessarily intended to refer to the same embodiment, implementation or example. Furthermore, particular features, structures, materials, or characteristics described may be combined in any suitable manner in any one or more embodiments, implementations or examples. Moreover, various embodiments, implementations or examples and features of various embodiments, implementations or examples described in this specification may be combined by one skilled in the art without contradiction.

While the embodiments of the present disclosure have been shown and described above, it will be understood that the above embodiments are exemplary and not to be construed as limiting the present disclosure, and changes, modifications, substitutions and alterations may be made to the embodiments by one skilled in the art within the scope of the present disclosure.

What is claimed is:

1. A display panel, comprising a first display area and a second display area, the first display area being arranged on a side of the second display area and the second display area being arranged opposite to an under display camera, wherein the display panel comprises a base substrate, the first display area comprises a plurality of first light emitting units, a plurality of second pixel circuits and a plurality of first pixel circuits located on the base substrate, the second pixel circuits and the first pixel circuits are arranged in an array along a first direction and a second direction, the first pixel circuits are configured to drive the first light emitting units to emit light, and the first direction intersects the second direction;

the second display area comprises a plurality of second light emitting units disposed on the base substrate, the second pixel circuits are configured to drive the second light emitting units to emit light, the second pixel circuits and the first pixel circuits each comprise an active layer, a source-drain electrode layer, a gate line and a storage capacitor, each of the second pixel circuits further comprises a first via hole and a second via hole, the source-drain electrode layer in the second pixel circuit comprises a drain electrode, the drain electrode comprises a first connection terminal, a second connection terminal and a connection body connecting the first connection terminal with the second connection terminal, wherein the first via hole is configured to electrically connect the first connection terminal with the active layer in the second pixel circuit, the connection body extends along the first direction, a length of the connection body is greater than or equal to a length of the storage capacitor in the first direction, the gate line extends along the second direction, the gate line comprises a reset control signal line, a scan signal line and a light emitting control signal line, an orthographic projection of the second via hole on the base substrate overlaps an orthographic projection of the scan signal line on the base substrate, the display panel further comprises a plurality of first wires located on a side, away from the base substrate, of the source-drain electrode layer, each first wire is electrically connected with the second connection terminal through the second via hole, and is electrically connected with an anode of the second light emitting unit through a third via hole in the second display area to drive the second light emitting unit to emit light.

2. The display panel according to claim 1, wherein each first pixel circuit further comprises a fourth via hole and a fifth via hole, the fourth via hole is configured to electrically connect the source-drain electrode layer in the first pixel circuit with an anode of the first light emitting unit, the fifth via hole is configured to electrically connect the source-drain electrode layer in the first pixel circuit with the active layer, and an orthographic projection of the fourth via hole on the base substrate overlaps an orthographic projection of the fifth via hole on the base substrate.

3. The display panel according to claim 1, wherein an orthographic projection of the connection body on the base substrate overlaps an orthographic projection of the storage capacitor on the base substrate.

4. The display panel according to claim 1, wherein each first wire comprises a first sub-wire and a second sub-wire in the first direction, and orthographic projections of the first sub-wire and the second sub-wire on the base substrate are not overlapped with an orthographic projection of the connection body on the base substrate.

5. The display panel according to claim 4, wherein the orthographic projection of the first sub-wire on the base substrate overlaps an orthographic projection of a sixth via hole on the base substrate, the sixth via hole is configured to electrically connect a data writing transistor with a data line;
the orthographic projection of the second sub-wire on the base substrate overlaps an orthographic projection of a seventh via hole on the base substrate, the seventh via hole is configured to electrically connect a first terminal of a first connection portion of the source-drain electrode layer with a threshold compensating transistor, and the first connection portion is configured to connect a source/drain electrode of the threshold compensating transistor with a source/drain electrode of a driving transistor.

6. The display panel according to claim 5, wherein an orthographic projection of the second connection terminal in the second direction overlaps an orthographic projection of a middle body of the first connection portion in the second direction.

7. The display panel according to claim 5, wherein each first wire further comprises a third sub-wire in the first direction, and an orthographic projection of the third sub-wire on the base substrate overlaps the orthographic projection of the connection body on the base substrate.

8. The display panel according to claim 1, wherein the anode of each second light emitting unit comprises a body and a protruding portion, each first wire is disposed corresponding to the anode of the second light emitting unit, and each first wire is electrically connected to the protruding portion through the second via hole.

9. The display panel according to claim 8, wherein a distance between a surface of the body of the anode away from the base substrate and a surface of the first wire away from the base substrate is d1, a distance between a surface of the protruding portion away from the base substrate and a surface of the first wire away from the base substrate is d2, and a ratio of d1 to d2 ranges from 0.8 to 1.2.

10. The display panel according to claim 1, wherein a transition display area is provided between the first display area and the second display area, the transition display area is provided therein with a third pixel circuit, a third light emitting unit, and a fourth pixel circuit, and the third pixel circuit is configured to drive the third light emitting unit to emit light.

11. The display panel according to claim 2, wherein a plurality of second wires are disposed in the second display area at an edge of the second display area close to the transition display area, and the second wires are disposed in the same layer as the source-drain electrode layer, and are configured to transmit a reset signal and a charging signal in the first display area.

12. The display panel according to claim 1, comprising:
the base substrate;
the active layer arranged on a side of the base substrate;
a gate insulating layer arranged on a side of the base substrate and the active layer;
a gate electrode arranged on a surface of the gate insulating layer away from the base substrate;
an interlayer dielectric layer arranged on surfaces, away from the base substrate, of the gate insulating layer and the gate electrode, with the first via hole penetrating through the gate insulating layer and the interlayer dielectric layer;
the source-drain electrode layer arranged on a surface of the interlayer dielectric layer away from the base substrate;
a first planarization layer arranged on a side, away from the base substrate, of the interlayer dielectric layer and the source-drain electrode layer, with the second via hole penetrating through the first planarization layer;
the first wires arranged on a side, away from the base substrate, of the first planarization layer and each electrically connected with the second connection terminal through the second via hole;
a second planarization layer arranged on a side, away from the base substrate, of the first planarization layer and the first wires, with a third via hole penetrating through the second planarization layer, and each first wire being electrically connected with the anode of the second light emitting unit through the third via hole.

13. The display panel according to claim 1, wherein a plurality of patterned cathode layers are provided in the second display area, and an orthographic projection of each patterned cathode layer on the base substrate covers an orthographic projection of an anode of at least one of the second light emitting units on the base substrate.

14. The display panel according to claim 13, wherein cathodes of light emitting units in the first display area and the transition display area are formed into one piece in a same layer.

15. The display panel according to claim 13, further comprising a plurality of third wires, wherein the third wires are disposed in the same layer as the first wires, the third wire are disposed corresponding to the patterned cathode layers one to one, and the third wires are configured to electrically connect the patterned cathode layers with a VSS signal line.

16. The display panel according to claim 13, further comprising a plurality of package sub-layers arranged at intervals, wherein the package sub-layers are arranged in correspondence with the patterned cathode layers one to one, and an orthographic projection of each of the package sub-layers on the base substrate covers an orthographic projection of one of the patterned cathode layers on the base substrate.

17. A method for manufacturing the display panel according to claim 1, wherein the display panel comprises a first display area and a second display area, the first display area is disposed on a side of the second display area, and the second display area is arranged opposite to an under display camera, the method comprises:

providing a base substrate, and forming a plurality of second pixel circuits and a plurality of first pixel circuits arranged in an array along a first direction and a second direction and a plurality of first light emitting units in a region of the base substrate corresponding to the first display area, wherein the first pixel circuits are configured to drive the first light emitting units to emit light, and the first direction intersects the second direction;

forming a plurality of second light emitting units in a region of the base substrate corresponding to the second display area, the second pixel circuits being configured to drive the second light emitting units to emit light, forming the second pixel circuits and the first pixel circuits comprises forming an active layer, a source-drain electrode layer, a gate line, and a storage capacitor, the method further comprises:

forming a first via hole and a second via hole in each second pixel circuit, wherein the source-drain electrode layer in each second pixel circuit comprises a drain electrode, the drain electrode has a first connection terminal, a second connection terminal, and a connection body connecting the first connection terminal with the second connection terminal, the first via hole is configured to electrically connect the first connection terminal with the active layer in the second pixel circuit, the connection body extends along the first direction, a length of the connection body is greater than or equal to a length of the storage capacitor in the first direction, the gate line extends along the second direction, the gate line comprises a reset control signal line, a scan signal line and a light emitting control signal line, and an orthographic projection of the second via hole on the base substrate overlaps an orthographic projection of the scan signal line on the base substrate, and forming a plurality of first wires on a side of the source-drain electrode layer away from the base substrate, wherein each first wire is electrically connected with the second connection terminal through the second via hole and is electrically connected with an anode of the second light emitting unit through a third via hole in the second display area to drive the second light emitting unit to emit light.

18. The method according to claim 17, further comprising: forming the anode of the second light emitting unit by etching, wherein the anode comprises a body and a protruding portion, and the first wire is electrically connected to the protruding portion through the second via hole.

19. The method according to claim 17, further comprising:

patterning the cathode in the second display area to obtain a plurality of patterned cathode layers, wherein an orthographic projection of each patterned cathode layer on the base substrate covers an orthographic projection of the anode of at least one of the second light emitting units on the base substrate.

20. A display device, comprising:

the display panel according to claim 1; and an under display camera provided on a back of the display panel, with an orthographic projection of the under display camera on the display panel overlapping the second display area of the display panel.

\* \* \* \* \*